(12) United States Patent
Atulasimha et al.

(10) Patent No.: US 8,921,962 B2
(45) Date of Patent: Dec. 30, 2014

(54) PLANAR MULTIFERROIC/MAGNETOSTRICTIVE NANOSTRUCTURES AS MEMORY ELEMENTS, TWO-STAGE LOGIC GATES AND FOUR-STATE LOGIC ELEMENTS FOR INFORMATION PROCESSING

(75) Inventors: Jayasimha Atulasimha, Glen Allen, VA (US); Supriyo Bandyopadhyay, Glen Allen, VA (US)

(73) Assignee: Virginia Commonwealth University, Richmond, VA (US)

( * ) Notice: Subject to any disclaimer, the term of this patent is extended or adjusted under 35 U.S.C. 154(b) by 153 days.

(21) Appl. No.: 13/447,431

(22) Filed: Apr. 16, 2012

(65) Prior Publication Data

US 2012/0267735 A1 Oct. 25, 2012

Related U.S. Application Data

(60) Provisional application No. 61/476,868, filed on Apr. 19, 2011, provisional application No. 61/556,858, filed on Nov. 8, 2011.

(51) Int. Cl.
*H01L 21/02* (2006.01)
*H01L 29/82* (2006.01)
*G11C 11/16* (2006.01)
*H01L 27/20* (2006.01)

(52) U.S. Cl.
CPC ............... *G11C 11/16* (2013.01); *H01L 27/20* (2013.01)
USPC ............ 257/431; 257/E29.293; 257/E21.002; 438/3

(58) Field of Classification Search
CPC ................................ H01L 29/82; H01L 21/02
USPC ................ 257/421, E29.323, E21.002; 438/3
See application file for complete search history.

(56) References Cited

U.S. PATENT DOCUMENTS 6,483,741 B1 * 11/2002 Iwasaki et al. ................. 365/170
2006/0133137 A1 * 6/2006 Shin et al. ...................... 365/158

(Continued)

OTHER PUBLICATIONS

Roy et al.; "Error-resilient switching of a bistable switch without asymmetry in its potential profile"; CORD Conference Proceedings in press (2011), Nov. 23, 2011; pp. 1-15.

(Continued)

*Primary Examiner* — Kevin Parendo
*Assistant Examiner* — Lamont Koo
(74) *Attorney, Agent, or Firm* — Whitham Curtis Christofferson & Cook, PC

(57) ABSTRACT

A magnetostrictive-piezoelectric multiferroic single- or multi-domain nanomagnet whose magnetization can be rotated through application of an electric field across the piezoelectric layer has a structure that can include either a shape-anisotropic magnetostrictive nanomagnet with no magnetocrystalline anisotropy or a circular nanomagnet with biaxial magnetocrystalline anisotropy with dimensions of nominal diameter and thickness. This structure can be used to write and store binary bits encoded in the magnetization orientation, thereby functioning as a memory element, or perform both Boolean and non-Boolean computation, or be integrated with existing magnetic tunneling junction (MTJ) technology to perform a read operation by adding a barrier layer for the MTJ having a high coercivity to serve as the hard magnetic layer of the MTJ, and electrical contact layers of a soft material with small Young's modulus. Equivalently, mangnetostrictive nanomagnetic elements whose magnetization is rotated by strain transferred from the substrate that has acoustic waves propagating on the substrate can be used.

5 Claims, 11 Drawing Sheets

(56) References Cited

U.S. PATENT DOCUMENTS

| | | | |
|---|---|---|---|
| 2009/0097295 A1* | 4/2009 | Morimoto | 365/51 |
| 2010/0080048 A1* | 4/2010 | Liu et al. | 365/157 |
| 2010/0128520 A1* | 5/2010 | Zheng et al. | 365/171 |

OTHER PUBLICATIONS

Roy et al.; "Energy dissipation and switching delay in stress-induced switching of multiferroic devices in the presence of thermal fluctuations"; Nov. 26, 2011; pp. 1-8.

Atulashimha et al.; "Bennett clocking of nanomagnetic logic using multiferroic single-domain nanomagnets"; Applied Physics Letters, No. 97, 2010; pp. 1-31.

Roy et al.; "Hybrid spintronics and straintronics: A magnetic technology for ultra low energy computing and signal processing"; Applied Physics Letters, No. 99, 2011; pp. 1-3.

Fashami et al.; "Magnetization dynamics, throughput and energy dissipation in a universal multiferroic nanomagnetic logic gate with fan-in and fan-out"; Nanotechonology, No. 23, 2012; pp. 1-29.

Fashami et al.; "Magnetization dynamics, Bennett clocking and associated energy dissipation in multiferroic logic"; Nanotechnology, No. 22, 2011; pp. 1-10.

D'Souza et al.; "Four-state nanomagnetic logic using multiferroics"; Journal of Physics D: Applied Physics, No. 44, 2011; pp. 1-7.

D'Souza et al.; "Energy-efficient Bennett clocking scheme for four-state multiferroic logic"; IEEE Transactions on Nanotechnology, vol. 11, No. 2, Mar. 2012; pp. 418-425.

\* cited by examiner

PE = piezoelectric   Mag = magnetostrictive
HM = hard magnet

Magnet-1    Magnet-2
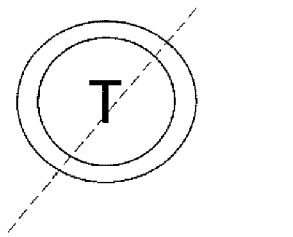 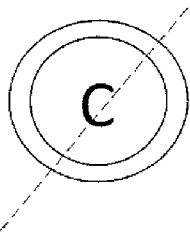  STEP-1
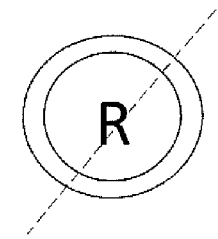 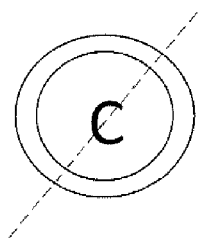  STEP-2
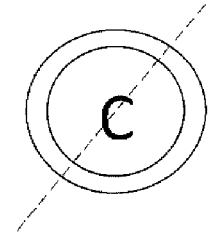 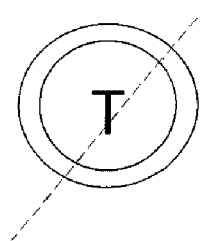  STEP-3
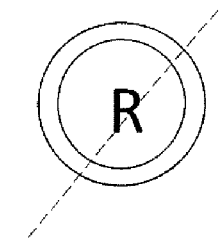 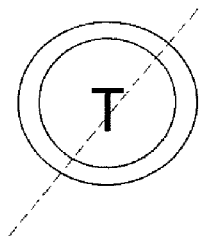  STEP-4
T=tension   C=compression
R=relaxation
/ = axis along which T/C/R is applied
Fig 12 D

PLANAR MULTIFERROIC/MAGNETOSTRICTIVE NANOSTRUCTURES AS MEMORY ELEMENTS, TWO-STAGE LOGIC GATES AND FOUR-STATE LOGIC ELEMENTS FOR INFORMATION PROCESSING

CROSS-REFERENCE TO RELATED APPLICATIONS

This application claims benefit of U.S. provisional patent applications 61/476,868, filed Apr. 19, 2011 and 61/556,858, filed Nov. 8, 2011, the complete contents of which is hereby incorporated by reference.

BACKGROUND OF THE INVENTION

1. Field of the Invention

The present invention generally relates to an ultra-low power/energy paradigm for memory, computing and information processing using multiferroic/magnetostrictive nanomagnets and, more particularly, to the use of planar multiferroic/magnetostrictive nanostructures as memory elements, two-state logic gates for traditional logic and four-state logic gates for performing higher order information processing. The invention includes novel multiferroic/magnetostrictive nanostructures design of memory elements, logic gates and other information processing elements with these structures, and processes for fabricating the same. These structures when used in memory or logic technology can potentially reduce energy consumption 1,000 to 10,000 times compared to the current state of the art, thereby enabling unique applications.

2. Background Description

The primary obstacle to continued downscaling of digital electronic devices in accordance with Moore's law is the excessive energy (or heat) dissipation that takes place in the device during switching. Unless this dissipation is reduced, downscaling of electronic devices and future progress will come to a stop. Current memory and logic circuits are very dissipative because they are transistor-based. Transistors use electron charge to encode information, which is inherently inefficient. Magnetic logic and memory systems, on the other hand, do not use charge to encode logic information; instead they use the magnetization of magnets to represent information. This can make them far less dissipative than transistors. Unfortunately, this advantage of magnets cannot be exploited unless the method employed to switch magnets is made energy-efficient. The magnetization of such single domain nanomagnets is usually switched with a spin-polarized current delivering a spin transfer torque. This technique is widely used in spin transfer torque random access memory (STTRAM). Unfortunately, this method of switching dissipates too much energy, and a more energy-saving approach is desirable. The invention described here fulfills this need since it is ~100,000 times more energy-efficient than spin-transfer-torque switching magnets.

SUMMARY OF THE INVENTION

The invention is the use of planar multiferroic/magnetostrictive nanostructures to implement extremely energy-efficient non-volatile memory elements, logic gates, logic propagation "wires" and higher order information processing systems.

The device according to the invention consists of a magnetostrictive layer deposited over or under a piezoelectric layer or vice versa. Such a two-layer structure is called a multiferroic. The device is shaped like an elliptical cylinder so that the magnetization of the magnetostrictive layer can have only two stable states along the major axis of the ellipse. These two states encode the binary bits 0 and 1. Thus, it already behaves like a memory element storing digital bit information. In order to change the bit information (i.e., write new data into the memory), a voltage is applied across the piezoelectric layer. That generates strain in that layer, which is transferred to the magnetostrictive layer via elastic coupling. The strain rotates the magnetization of the magnetostrictive layer, thereby switching the magnet from one magnetization state to another (or switching the bit from 0 to 1, or vice versa). This switching is sufficient to use the device as a writable memory element, or a logic element. Reading of the stored bit is accomplished by vertically integrating a magneto-tunneling junction (MTJ) underneath the device. The latter consists of a ~1 nm thin MgO layer and a hard magnet layer (e.g., Fe—Pt) of arbitrary thickness magnetized in a fixed direction. Note that synthetic anti-ferromagnet layer (SAF) separated from the hard (Fe—Pt) layer by a Ru spacer layer is added to minimize the dipole moment of the hard layer on the magnetostrictive layer. Measurement of the vertical resistance of the MTJ can unambiguously determine the magnetization state of the magnetostrictive layer and hence the stored bit.

Furthermore, if the magnetostrictive material is crystalline, then there can be four stable states which can encode four distinct logic bits. Again, a voltage applied across the piezoelectric layer can controllably switch the magnetization to any of these four states, resulting in four-state logic or memory as opposed to the more conventional two-state logic or memory. Since the switching is accomplished by rotating the magnetization (or equivalently the spins of the electrons in the magnet) using strain, we call this technology hybrid spintronics and straintronics.

A somewhat different version of this technology eliminates the piezoelectric layer and retains only the magnetostrictive layer. The latter layer is no longer strained by applying a voltage across the piezoelectric to generate a strain; instead, strain is generated in the magnetostrictive layer by a surface acoustic wave launched with inter-digitated contacts in the substrate on which the magnets rest. The frequency and velocity of the wave is adjusted such that the wavelength of the wave is roughly 4 times the distance between neighboring magnets. When the crest of the wave reaches a magnet, the latter is strained and that rotates its magnetization, thereby switching the magnet. This technology is also called hybrid spintronics/straintronics since once again the magnetization (or, equivalently spins of all the electrons in the magnets) is being rotated with strain.

This hybrid spintronics/straintronics technology for switching magnets is potentially 100,000 times more energy-efficient than spin-transfer-torque based switching of magnets which is the basis of spin-transfer-torque-random-access-memory (STTRAM) which is the dominant non-volatile memory technology today. It also makes magnet-based logic systems 1000-10,000 times more energy-efficient than transistor based logic and memory systems with the same switching speed. In fact, the energy required to operate hybrid spintronics/straintronics logic and memory systems is so low that they can run solely with energy harvested from the environment without requiring any external energy source or battery. Such low-power processors have unique applications, such as in: (1) implantable medical devices, for example devices implanted in a patient's brain that monitor brain waves to warn of impending epileptic seizures. They will run without a battery and harvest energy from the patient's body movements alone; (2) buoy-mounted or submerged processors that capture signatures of passing ships and submarines while being powered by the swaying motion induced by sea waves, and (3) in structural health monitoring systems that collect signals from a network of distributed sensors mounted on the structures to monitor fatigue, cracks, fracture and structural damage, while being powered by structural vibrations caused by wind or passing traffic.

These systems could replace existing computer non-volatile memory and storage technologies and central processing units (CPU) because they are much more energy efficient than current technologies. They will be particularly attractive in applications such as mobile electronics (e.g., cell phones) where battery life is important and in space based applications (e.g., in computers on board a deep space probe) where energy is always a premium.

BRIEF DESCRIPTION OF THE DRAWINGS

The foregoing and other objects, aspects and advantages will be better understood from the following detailed description of a preferred embodiment of the invention with reference to the drawings, in which:

FIG. 12D shows the clocking scheme involving the sequence of tension/compression/relaxation on two neighboring magnets for propagation of four-state logic.

DETAILED DESCRIPTION OF A PREFERRED EMBODIMENTS OF THE INVENTION

Figure 1:
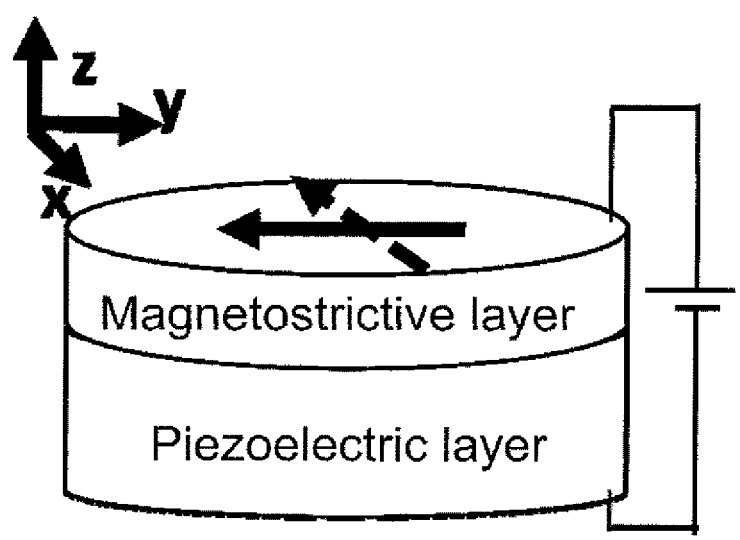
FIG. 1 is a diagrammatic view of a multiferroic/magnetostrictive structure constituting hybrid spintronics/straintronic logic or memory according to the invention.
Figure 2:
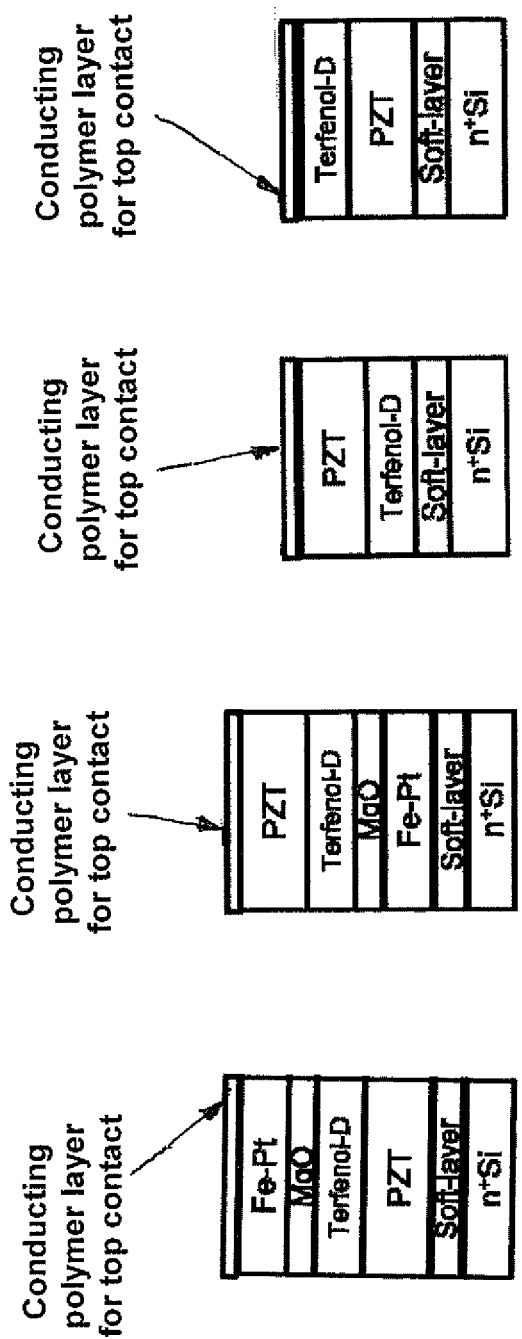
FIGS. 2A to 2D show elevation views of a multiferroic nanomagnetic structures according to the invention, with FIGS. 2A and 2B having a magneto-tunneling junction (MTJ) structure for read out and FIGS. 2C and 2D having a simpler multiferroic structure without read out with alternative structures fabricated in reverse order.
Figure 3:
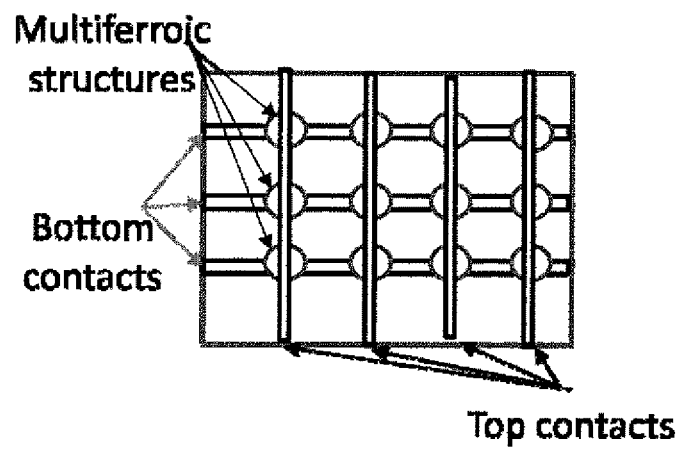
FIG. 3 is a plan view of the multiferroic structure with top and bottom contacts.
Figure 4:
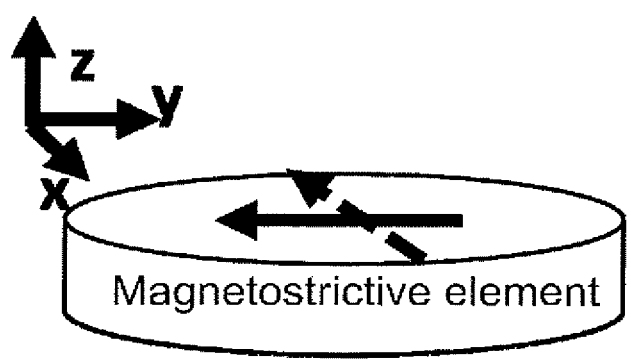
FIG. 4 is a diagrammatic view of the basic magnetostrictive element whose magnetization can be rotated by stress produced by an acoustic wave and also constitutes a hybrid spintronics/straintronic logic or memory element according to the invention.

A multiferroic structure consists of a piezoelectric layer (e.g., PZT) and a magnetostrictive layer (e.g., Nickel or Terfenol-D) as shown in FIG. 1. If the lateral dimensions are on the order of 100 nm and the magnetostrictive layer's thickness is approximately 10 nm, then the latter behaves like a single-domain nanomagnet. The elliptical shape of this single domain nanomagnet ensures that its magnetization can have only two stable orientations when no stress is applied on it: along the major axis of the ellipse, i.e., the +y and −y axis. These two magnetization states encode "0" and "1" states when the magnet is used to store binary bits. When an electric voltage is applied across the piezoelectric layer, it deforms and the resulting stress/strain is transferred to the magnetostrictive layer on top. The stress anisotropy in the magnetostrictive layer then causes its magnetization to rotate. For materials with positive magnetostriction (e.g., Terfenol-D), tensile stress favors a magnetization orientation parallel to itself and compressive stress favors a magnetization orientation perpendicular to itself. In the specific configuration shown in FIG. 1, the voltage applied strains the piezoelectric layer via the $d_{31}$ coupling and we ensure that uniaxial tension or compression is always applied along the y-axis by mechanically restraining the PZT layer from expansion or contraction along the x-axis (in-plane direction orthogonal to y-axis). The same could have been achieved by applying the electric field along the y-direction, which will generate a stress along the major axis of the ellipse via the $d_{33}$ coupling. Each multiferroic nanomagnet can be individually clocked and its magnetization state "read" by using a cross-bar architecture as shown in FIG. 3. Equivalently, one could use magnetostrictive nanomagnetic elements as shown in FIG. 4 whose magnetization is rotated by strain transferred from the substrate that has acoustic waves propagating on it. This alternative is particularly attractive since it eliminates the need to contact each element when no read-out is required. As a consequence, it reduces the lithography burden and increases production yield while reducing cost.

Figure 6:
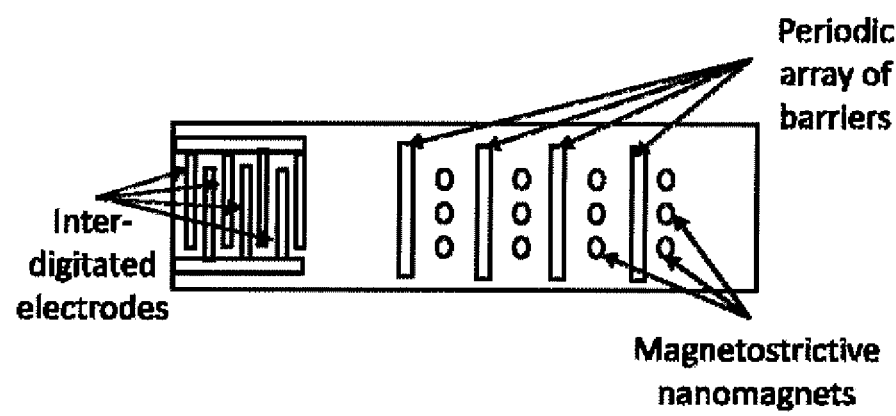
FIG. 6 is a plan view showing the magnetostrictive nanomagnetic elements of FIG. 5A or 5B on a piezoelectric substrate having an inter-digitated electrode to launch acoustic waves to acoustically clock the magnetostrictive nanomagnetic elements; wherein the group velocity of the acoustic waves can be suitably modified due to reflections caused by periodic array of barriers of appropriate aspect ratio placed between the nanomagnets in the path of propagation of the acoustic wave.

The manner in which these acoustic waves are generated is as follows: A surface acoustic wave (SAW) is launched in a substrate by delineating an inter-digitated array at one edge of the substrate as shown in FIG. 6. The wave propagates along the surface and is slowed down by multiple reflections from the magnets and barriers (masses) placed between the magnets. When the crest of the wave reaches a magnet, it strains and stresses the corresponding magnet, causing its magnetization to rotate. By choosing the frequency of the surface acoustic wave in such a way that the wavelength is equal to about one-fourth of the distance between neighboring magnets, one can sequentially clock the magnets with the SAW to implement Bennett clocking for logic propagation in the magnet array. The advantage of this scheme is that one will not require individual connections to every magnet, which reduces the lithography cost enormously.

FIG. 6 explains this scheme. The spacing between the magnets is ~200 nm, and hence we need the wavelength of the SAW to be 800 nm. Since the wavelength and frequency is related by $v=\lambda f$ where $v$ is the wave velocity, $f$ is the frequency and $\lambda$ is the wavelength, we need the velocity to be 400 m/s for a reasonable frequency of ~0.5 GHz. This velocity is attainable in most substrates since the magnets cause multiple reflections of the waves and that reduces the velocity substantially. Without reflection, the velocity would have been roughly the velocity of sound in the substrate which is of the order of ~4000 m/s. Multiple reflections between the magnets reduces the velocity of the SAW significantly, often by as much as 10 times, which is sufficient to slow the velocity down to ~400 m/s.

FIGS. 2A to 2D, 5A and 5B illustrate the structure of the multiferroic and mangnetostrictive nanomagnets, respectively, according to the invention. The "key" elements of the invention are the piezoelectric layer in intimate contact with a magnetostrictive layer and alternatively a magnetostrictive layer (without a piezoelectric layer) clocked by acoustic waves traveling on the substrate. This enables "writing" bits for memory and logic and "clocking" nanomagnetic logic. This basic structure can be integrated with existing magnetic tunneling junction (MTJ) technology to enable "reading" the bit. The possible range of dimensions is:

(1) Lateral dimensions: diameter in the range of approximately 10-11000 nm for both magnetostrictive and piezoelectric layer (when applicable).

(2) Thickness in the range of 2-100 nm for magnetostrictive layer and in the range of 10-500 nm for PZT layer (when applicable).

Figure 7:
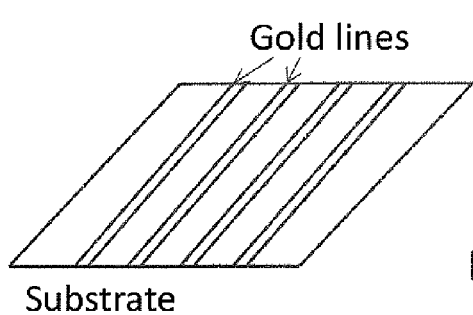
FIGS. 7A to 7F illustrate the process of fabricating the multiferroic/magnetostrictive structures according to the invention.
Figure 7:
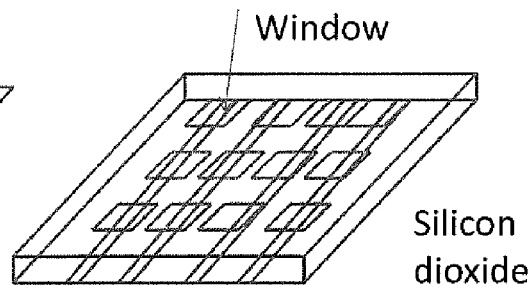
Figure 7:
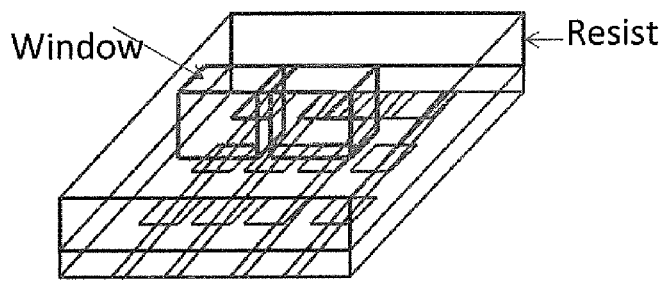
Figure 7:
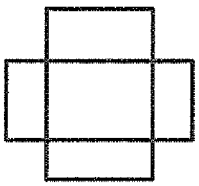
Figure 7:
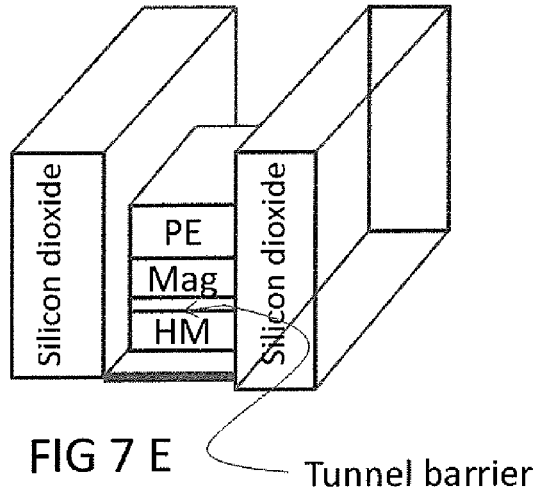
Figure 7:
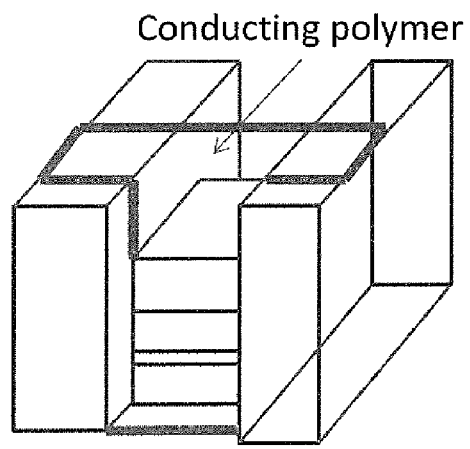

In the structure illustrated in FIGS. 2A to 2D, "PZT" can include any piezoelectric material such as, but not limited to, PMN-PT, PZT, Lithium Niobate; and in FIGS. 2A to 2D, 5A and 5B, "Terfenol-D" can include any magnetostrictive material such as, but not limited to, Ni, FeGa, Terfenol-D; "MgO" can include any insulating barrier layer such as, but not limited to, $Al_2O_3$ and MgO; "Fe—Pt" can include any hard layer; and "n+" can be any conducting/non-conducting substrate, with or without an elastically soft coating, depending on the architecture for the memory or logic device under consideration The fabrication approach for ultra-large-scale-integrated circuits that can be adopted by industry is illustrated in FIGS. 7A to 7F. The ideal architecture for memory or clocked logic is a cross-bar architecture that allows individual addressing of bits. Circuits are fabricated by the illustrated process. E-beam (or deep UV) lithography is used to lay down parallel arrays of gold lines on a silicon wafer that serves as the bottom contact as shown in FIG. 7A. Next, in FIG. 7B, silicon dioxide is sputtered and aligned rectangular windows are opened to expose gold lines underneath. Thereafter, in FIG. 7C, e-beam resist is spun and aligned transverse rectangular windows are opened in the resist. FIG. 7D shows a top view of the windows. A hard magnet (Fe—Pt), MgO, Terfenol-D and PZT are sequentially deposited into this window in FIG. 7E. The approximately 50 nm hard magnetic layer (Fe—Pt) deposited by evaporating has a very high coercivity on the order of 15 Tesla, if deposited in the proper L1 phase. Thereafter, ~1 nm layer of MgO that acts as the barrier layer of a spin valve is deposited with atomic layer deposition (ALD) equipment. The approximately 10 nm magnetostrictive Terfenol-D layer is then sputtered using a commercially available target. Note that a synthetic antiferromagnetic layer (SAF) should be added with the Fe—Pt layer. The SAF layers reduce dipole coupling between the hard (Fe—Pt) and soft (Terfenol-D) layers, thereby enabling the soft magnet's magnetization to rotate when stressed. Then, the approximately 40 nm PZT layer is deposited using pulsed laser deposition (PLD). Thereafter, lift-off is performed, leaving behind the multiferroic spin-valve structure. The PMMA (e-beam resist) on the front and back sides of the multiferroic structure is removed while $SiO_2$ to its left and right forms a rigid constraint, ensuring only uniaxial strain is developed when a potential is applied across the PZ layer. Next, in FIG. 7F, e-beam resist is spun and aligned trenches are opened to deposit the conducting polymer on top. This conducting polymer provides the top contact while not constraining the structure from expanding in the vertical or unconstrained lateral direction due to clamping because it is mechanically "soft" (very small Young's modulus). This is finally followed by lift off to create cross-bar architecture. The cross-bar is constituted by the Au lines at the bottom and the conducting polymer lines on top. The element at the intersection of a polymer line and a gold line is addressed via these lines.

The foregoing process may be modified as follows: the magnetostrictive layer (such as but not limited to Ni, FeGa, Terfenol-D) may be formed over the barrier layer by sputtering, thermal or electron-beam evaporation, or molecular beam epitaxy growth. It should be noted that the shape of anisotropic nanomagnets are achieved by defining elliptical, rectangular or other anisotropic geometry with lithography and depositing polycrystalline magnetostrictive materials while nanomagnets with biaxial magneto crystalline anisotropy are fabricated with circular geometry and deposition of single-crystal magnetostrictive materials. Deposition of the piezoelectric layer over the magnetostrictive layer may be performed using atomic layer deposition (ALD) or pulsed laser deposition (PLD). The soft electrical contacts for electrically accessing the bottom and the top of the piezoelectric layer, using soft conductors include, but are not limited to indium. The layers of the structure can also be fabricated in the reverse order as shown in FIGS. 2A to 2D. This process (with simplification and without PZT layer) can be used to fabricate the structures shown in FIGS. 5A and 5B. The process is further simplified for both multiferroic and magnetostrictive structures where no read-out (MTJ layer) is required.

Figure 8:
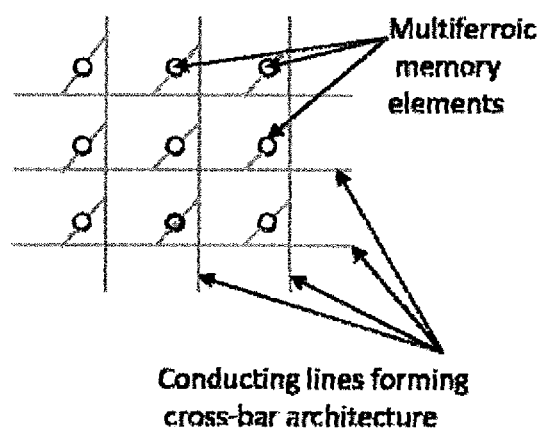
FIG. 8 is an illustration of a two-state multiferroic nanomagnet used as a memory element with cross bar architecture for addressing each memory element individually.

The cross bar architecture shown in FIG. 3 can be used to address the extremely energy efficient memory realized using multiferroic nanomagnets as shown in FIG. 8 that can be written and read as follows:

Writing data: See K. Roy, S. Bandyopadhyay and J. Atulasimha, "Hybrid spintronics and straintronics: A magnetic technology for ultra low energy computing and signal processing", *Applied Physics Letters*, 99, 063108, 2011. The key result of this work is that the magnetization state of a nanomagnet storing a bit (and hence acting as a non-volatile memory element) can be switched (flipped by 180°) by applying a stress cycle. Thus, if the stress which applied by the piezoelectric layer is withdrawn (by reducing the voltage to zero) when the magnetization reaches the hard axis, the magnetization continues to rotate and settles to the easy axis opposite to the one it started from. This is due to complex in-plane and out-of-plane coupling of the magnetization dynamics (Kuntal Roy, Supriyo Bandyopadhyay, Jayasimha Atulasimha, "Error-resilient switching of a bistable switch without introducing asymmetry in its potential profile", arXiv:1111.5390v1) that results in switching of the magnetization with high reliability even in the presence of thermal fluctuations (Kuntal Roy, Supriyo Bandyopadhyay, and Jayasimha Atulasimha, "Energy dissipation and switching delay in stress-induced switching of multiferroic devices in the presence of thermal fluctuations", arXiv:1111.6129v1). In order to either write data in an addressed element (for memory, FIG. 8) or to clock an addressed element (for logic, as described later), the corresponding polymer line and gold line are activated to apply a voltage between these two lines, as shown in FIG. 3. Most of this voltage is dropped across the PZT layer since the MgO layer is very thin and the other layers are metallic. This will expand the PZT layer in the unconstrained direction, generating uniaxial strain and magnetization rotation in the Terfenol-D layer. Note that in writing operation (for memory) or clocking operation (for logic), we need not pass any current through any of the layers, so that we can apply a very small voltage between the polymer and gold lines, resulting in very small energy dissipation.

Reading data: The vertically integrated spin valve structure is used to read a bit using the usual approach. Note that this device is vertically integrated under the magnet and hence consumes no real estate on the chip. If the magnetization of the Terfenol-D layer is parallel to that of the Fe—Pt layer (stored bit=0), then the resistance of the spin valve (comprising the Terfenol-D layer, MgO and Fe—Pt) will be small (assuming Terfenol-D and Fe—Pt have the same sign of spin polarization), while if the magnetization of the Terfenol-D layer is anti-parallel to that of the Fe—Pt layer (stored bit=1), the resistance of the spin valve will be large. Thus, reading of the bits requires simply a resistance measurement, which can be carried out with a small ac current, resulting in minimal dissipation.

Figure 12A:
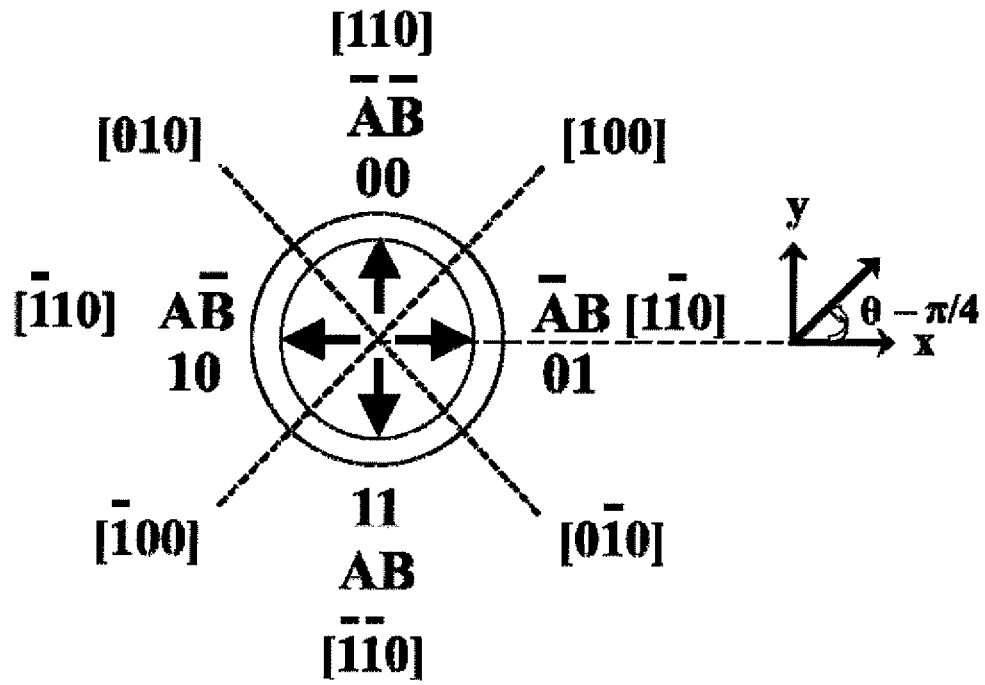
FIG. 12A shows four-state logic using bi-axial magneto crystalline anisotropy.
Figure 12B:
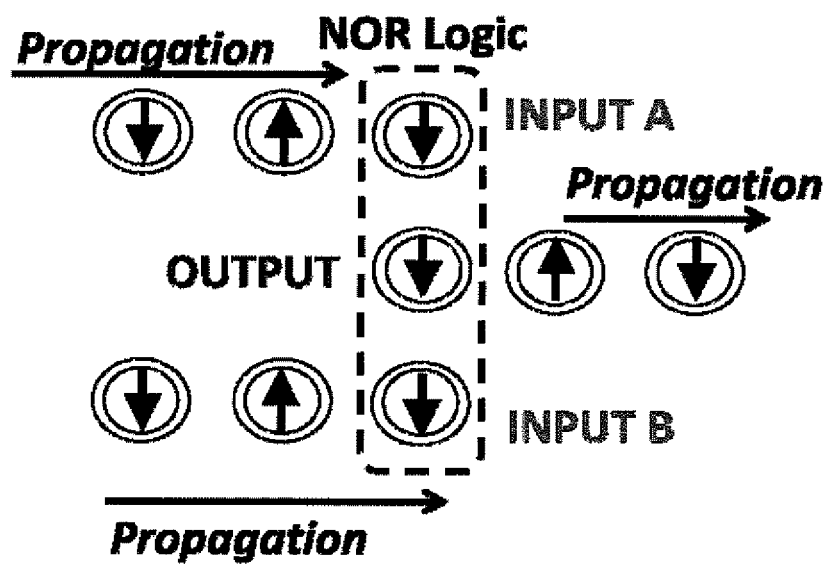
FIG. 12B illustrates fan-in and output for a four-state NOR gate.

Reading data in four-state logic: Since the current passing through a spin valve structure is proportional to $\cos^2(\theta/2)$, where $\theta$ is the angle between the magnetization axes of Terfenol-D and Fe—Pt, the parallel and anti-parallel states are always easily distinguishable. Hence, there is never any difficulty in reading bits for two-state logic. Reading bits in four-state logic shown in FIG. 12A is more challenging. For this purpose, the Fe—Pt layer is magnetized at 30° to one of the easy magnetic axes as shown in FIG. 12B. Then the 4-states of the device will be easily distinguishable ($\theta=30°$, 120°, 210°, 300°, so that $\cos^2(\theta/2)=0.933$, 0.250, 0.067, 0.750).

Figure 9:
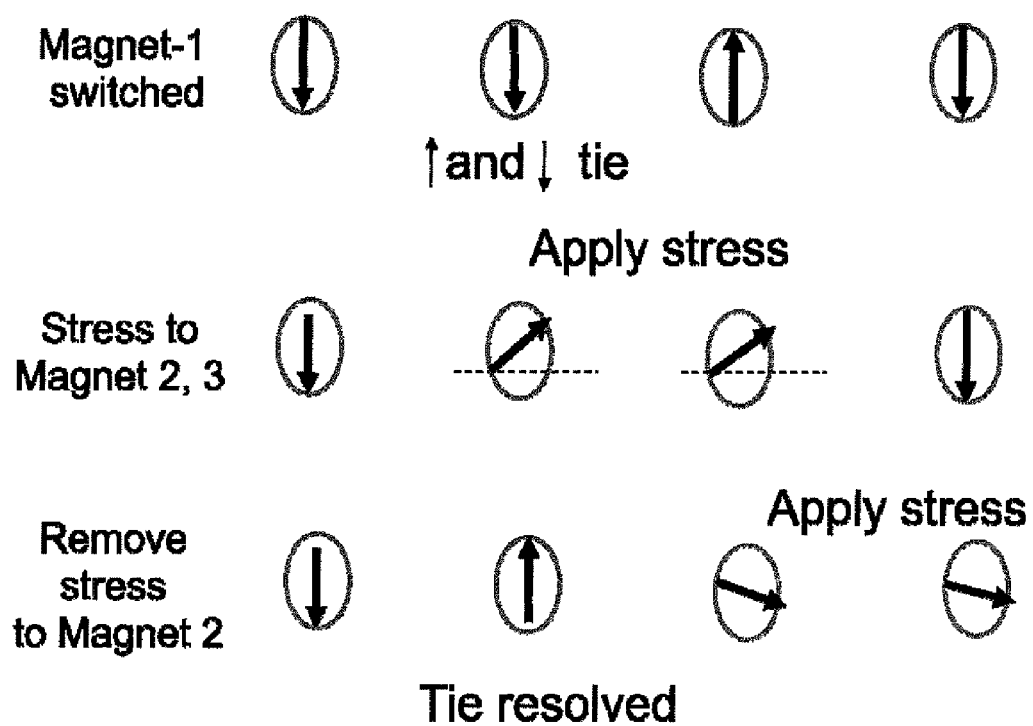
FIG. 9 is an illustration of Bennett clocking of two state multiferroic/magnetostrictive nanomagnetic logic.

Our first theoretical result (J. Atulasimha and S. Bandyopadhyay, "Bennett clocking of nanomagnetic logic using multiferroic single-domain nanomagnets", *Appl. Phys. Lett.* 97, 173105, 2010) showed that it is possible to rotate the magnetization of a multiferroic (PZT/Terfenol-D) elliptical single-domain nanomagnet through 90° and also implement Bennett clocking (C. H. Bennett, "The thermodynamics of computation: A review", *Int. J. Theor. Phys.*, 77, 905 (1982)) of nanomagnetic logic chains to propagate bits down an array of nanomagnets as shown in FIG. 9. Calculations indicated that this would consume only about 100 kT of energy. To determine switching time, we solved the vector Landau Lifshitz Gilbert (LLG) equation for an array of 4 dipole coupled multiferroic nanomagnets shown in FIG. 9 (Mohammad Salehi Fashami, Kuntal Roy, Jayasimha Atulasimha, Supriyo Bandyopadhyay, "Magnetization dynamics, Bennett clocking and associated energy dissipation in multiferroic logic", *Nanotechnology*, 22, 155201, 2011):

$$\frac{d\vec{M}(t)}{dt} = -\gamma \vec{M}(t) \times \vec{H}_{eff}(t) - \alpha\gamma \vec{M}(t) \times [\vec{M}(t) \times \vec{H}_{eff}(t)] \quad (1)$$

The equivalent field ($H_{eff}$) that accounts for the shape anisotropy, stress anisotropy due to stress induced by application of an electric field to the PZT layer and dipole interaction is determined as:

$$\vec{H}_{eff}(t) = -\frac{1}{\mu_0 \Omega} \frac{dE(t)}{d\vec{M}(t)}; \quad (2)$$

$$E(t) = E_{shape-anisotropy}(t) + E_{stress-anisotrophy}(t) + E_{dipole}(t)$$

where $\vec{M}(t)$=magnetization at time t, $\gamma$=gyro-magnetic ratio, $\alpha$=Gilbert damping, $\Omega$=nanomagnet volume, E is the total energy that comprises the sum of energy due to shape anisotropy ($E_{shape-anisotropy}$ due to the geometric shape of the magnet), stress anisotropy ($E_{stress-anisotropy}$ that results from a stress acting on a magnetostrictive material) and dipole coupling ($E_{dipole}$ interaction of the magnet with the dipole field of its neighbors).

We showed that by applying approximately 26 mV to the 40 nm thick PZT layer, we can generate enough stress-anisotropy in the magnetostrictive layer to realize Bennett clocking in approximately 1 ns and expend a total of only about 400 kT (or ~10 eV) of energy in both the clocking circuit and energy dissipated in the nanomagnets combined. Here, 5.2 MPa compressive stress is applied on the magnetostrictive Terfenol-D layer at time t=0 on nanomagnets 2 and 3 rotating them both through 90°, i.e., close to the hard axis in 0.6 ns. Thereupon stress is reduced to zero on the second nanomagnet, while it is kept constant on the third nanomagnet. Under the dipole coupling from the first nanomagnet, the second nanomagnet relaxes to a state anti-parallel to the first in approximately 0.4 ns, thus propagating the logic bit along the chain in about 1 ns. Finally, we have shown structures of these dimensions have a mechanical resonance frequency on the order of 7 GHz that will not limit the approximately 1 GHz switching.

Figure 5A:
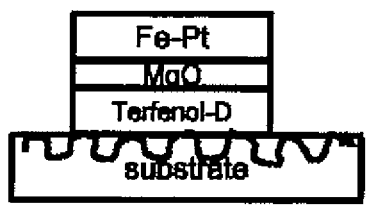
FIGS. 5A and 5B show elevation views of magnetostrictive nanomagnetic elements, with FIG. 5A having an MTJ structure for read out and FIG. 5B having a simpler magnetostrictive structure without read out that will be clocked by acoustic waves propagating on the substrate.
Figure 5B:
Figure 10:
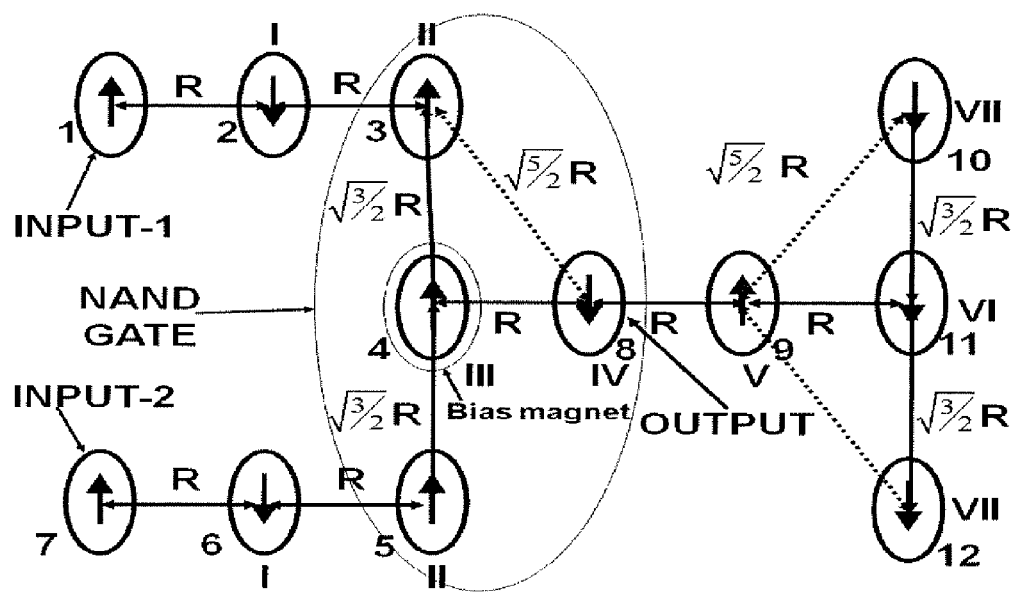
FIG. 10 illustrates an all multiferroic/magnetostrictive NAND gate with fan-out.
Figure 11:
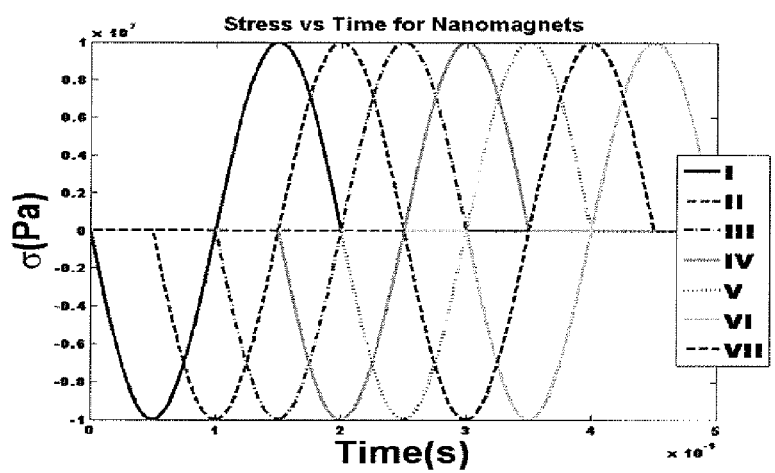
FIG. 11 is a graphical representation of four phase clocking the all multiferroic/magnetostrictive NAND gate shown in FIG. 10.

FIG. 10 illustrates an all multiferroic NAND gate. The 12 magnets shown in FIG. 10 comprise the NAND-gate and wiring for fan-in of two and fan-out of two. The stress applied on the four nanomagnets comprising the actual gate follows a 4-phase sinusoidal clocking scheme as shown in FIG. 11. The magnets are grouped into seven groups I through VII. The sinusoidal clocks applied to each group and the relative phase lags between the clock signals for different groups is shown in FIG. 11. Clearly, a phased clock (for example 4-phase clock) is required. When the phase for the clock on magnets marked "I" goes past 90° so that the compressive stress on these magnets begins to decrease, the compressive stress on magnets marked "II" just begins to increase. Thus, when the stress on magnets "I" has decreased to 70% of the maximum applied compression, the magnets marked "II" are at a state of 70% of the maximum compression and have been sufficiently rotated away from the easy direction. Consequently, as compressive stress decreases to a point where the shape anisotropy begins to dominate and therefore the magnetizations of magnets marked "I" rotate towards their easy axes, their orientation is influenced strongly and ultimately uniquely determined by the orientations of the "input" magnets ensuring unidirectionality of information propagation (see Mohammad Salehi Fashami, Jayasimha Atulasimha, Supriyo Bandyopadhyay, "Magnetization Dynamics, Throughput and Energy Dissipation in a Universal Multiferroic Nanomagnetic Logic Gate with Fan-in and Fan-out", *Nanotechnology*, 23 105201, 2012). Our theoretical simulations confirm:

(I) successful NAND operation for any arbitrary input combination [(1,1), (0,0), (1,0), (0,1)] starting with the initial input state (1, 1), and for all other cases in the supplement (ii) the completion of the primitive gate operation in 2 ns with the latency is 4 ns. Energy consumption in all nanomagnets is ~1000 kT, which is three to four orders of magnitude more energy efficient than current state of the art. More particularly, we have proved through simulation that the NAND gate, as well as fan-in and fan-out, work correctly for all four input combinations for a given initial state of the nanomagnets. This is shown explicitly in the supplementary material accompanying the main paper *Nanotechnology*, 23 105201, 2012, which is available on-line. Finally, we note that one could use magnetostrictive nanomagnetic elements as shown in FIG. 4 whose magnetization is rotated by strain transferred from the substrate that has surface acoustic waves propagating (as shown in FIGS. 5A and 5B instead of the multiferroic nanomagnets described above. This will work for both logic propagation and universal logic gates (with suitable modifications to geometric layout).

Figure 12C:
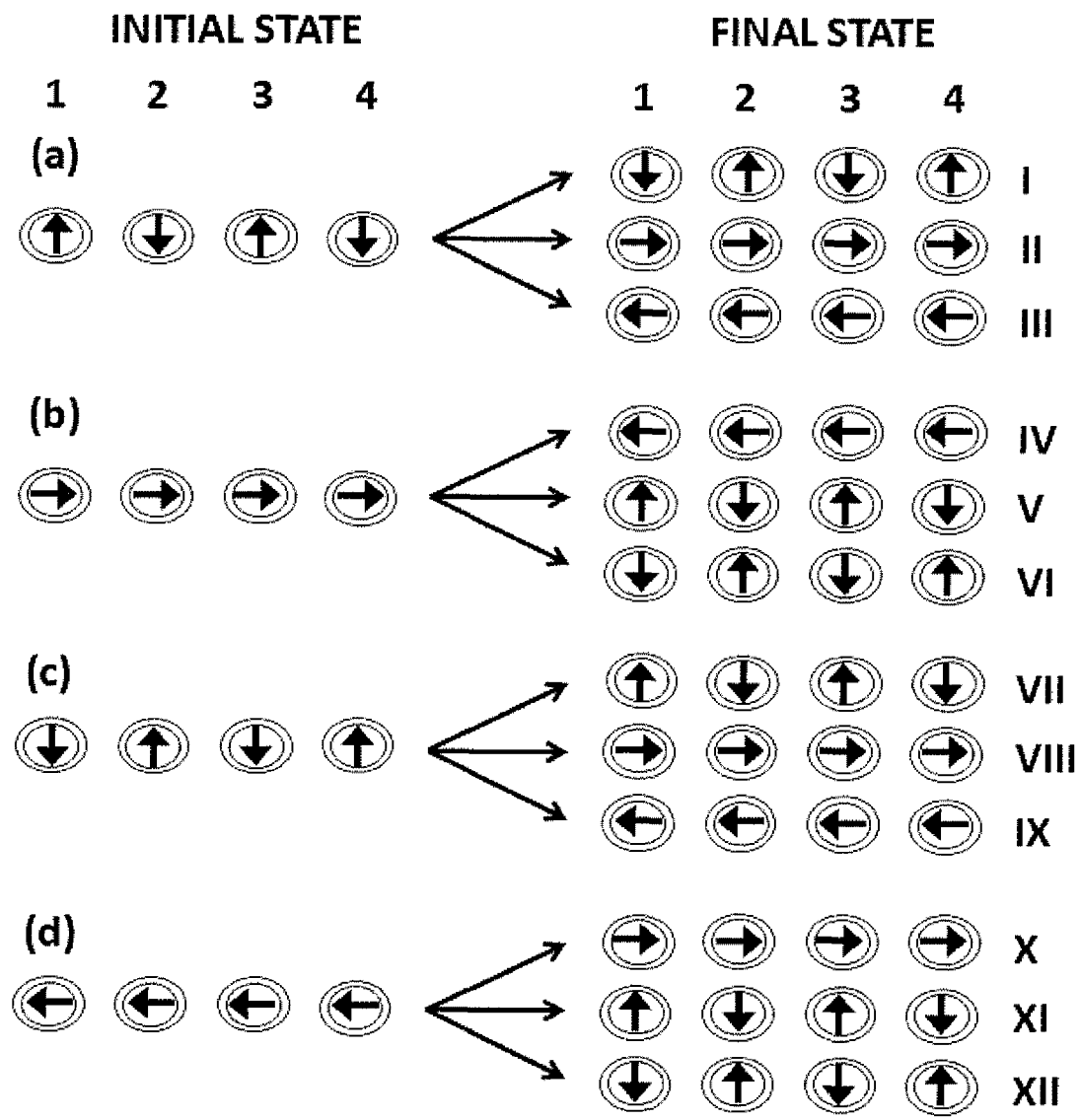
FIG. 12C shows the propagation of four-state logic.

Four state logic and four-state universal logic gate and propagation "wire" are illustrated in FIGS. 12A to 12C. While two-state devices may suffice for computing and simple image processing operations such as line detection, four-state logic devices are needed for "associative" memory that is useful for neuromorphic computation. With this in mind, we have shown that it is possible to realize a four-state logic gate (Noel D'Souza, Jayasimha Atulasimha, Supriyo Bandyopadhyay, "Four-state nanomagnetic logic using multiferroics", *J. of Physics D: Applied. Physics*, 44 265001, 2011) and propagate this logic down a chain of nanomagnets (Noel D'Souza, Jayasimha Atulasimha, Supriyo Bandyopadhyay, "Prorogation of four-state nanomagnetic logic using multiferroic clocking", *IEEE Transactions on Nanotechnology*, 11, 418, 2012.) using multiferroic materials. This can be accomplished with a magnetostrictive layer (for example single-crystal Ni), which would exhibit biaxial magneto crystalline anisotropy in the (001) plane. These four easy in-plane magnetization orientations the [110], [110], [110] and [110], are shown in FIG. 12A. These "up", "right", "down", "left" states are chosen to respectively encode the four possible input combinations "00", "01", "11" and "10" (see FIG. 12A). We have shown that:

(I) In an array of three multiferroic nanomagnets as shown in FIG. 12B, that are "clocked" by applying a tension cycle followed by a compression cycle, the magnetization of the central nanomagnet always attains a final orientation that depends only on the orientations of the two peripheral magnets. If we encode 4-state input bits in the four possible stable orientations of the peripheral magnets and call them "input" bits, while calling the orientation of the central magnet the "output" bit, the output is always the Boolean NOR function of the inputs. This realizes a universal 4-state universal logic gate.

(ii) When the first nanomagnet (four-state input) in the nanomagnetic chain is flipped, this information can be propagated down the chain by a series of unique compression and tension cycle, the new Bennett clocking scheme developed for four-state logic shown in FIG. 12D. This is shown in FIG. 12C. Thus, there exists a scheme for Bennett clocking of four-state logic as well and the above method implements this scheme.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A magnetostrictive-piezoelectric multiferroic nanomagnet for implementing low energy two state Boolean logic and information processing or multistate Boolean and non-Boolean logic and information processing comprising:

a silicon base layer on which is formed a first electrical contact;

a magnetostrictive layer and a piezoelectric layer formed over the silicon base layer and arranged such that magnetization of the magnetostrictive-piezoelectric multiferroic nanomagnet can be rotated through an of an electric field across the piezoelectric layer;

a barrier layer followed by a hard magnet layer deposited over the magnetostrictive layer; and a second electrical contact, wherein the first and second electrical contacts apply the electric field across the piezoelectric layer through the magnetostrictive layer and generate a stress or a strain in the piezoelectric layer that is transferred to the magnetostrictive layer, wherein only the stress or the strain rotates magnetization of the magnetostrictive layer without applying a spin polarized current through the magnetostrictive-piezoelectric multiferroic nanomagnet, wherein the hard magnet layer comprises a magnetically hard layer separated from a synthetic anti-ferromagnet (SAF) layer by a suitable spacer layer to minimize dipole coupling between the layers, and wherein a read operation of the nanomagnet is facilitated using magnetic tunneling junction (MTJ) technology.

2. The magnetostrictive-piezoelectric multiferroic nanomagnet for implementing low energy two state Boolean logic and information processing or multistate Boolean and non-Boolean logic and infolination processing as recited in claim 1, wherein the magnetostrictive layer has a nominal diameter between 10 and 1000 nm and thickness between 2 and 100 nm, and the piezoelectric layer has a thickness between 10 and 500 nm.

3. A magnetostrictive-piezoelectric multiferroic nanomagnet for implementing low energy two state Boolean logic and information processing or multistate Boolean and non-Boolean logic and information processing comprising:

a silicon base layer on which is formed a first electrical contact;

a magnetostrictive layer and a piezoelectric layer formed over the silicon base layer and arranged such that magnetization of the magnetostrictive-piezoelectric multiferroic nanomagnet can be rotated through application of an electric field across the piezoelectric layer; and a second electrical contact, wherein the first and second electrical contacts apply the electric field across the piezoelectric layer through the magnetostrictive layer and generate a stress or a strain in the piezoelectric layer that is transferred to the magnetostrictive layer, wherein only the stress or the strain rotates magnetization of the magnetostrictive layer without applying a spin polarized current through the magnetostrictive-piezoelectric multiferroic nanomagnet, and wherein the magnetostrictive-piezoelectric multiferroic nanomagnet is dipole-coupled to at least one neighboring magnetostrictive-piezoelectric multiferroic nanomagnet, and wherein the magnetostrictive-piezoelectric multiferroic nanomagnet interacts with a dipole field of the at least one neighboring magnetostrictive-piezoelectric multiferroic nanomagnet.

4. The magnetostrictive-piezoelectric multiferroic nanomagnet for implementing low energy two state Boolean logic and information processing or multistate Boolean and non-Boolean logic and information processing as recited in claim 3 further comprising:

a barrier layer followed by a hard magnet layer deposited over the magnetostrictive layer, wherein the hard magnet layer comprises a magnetically hard layer separated from a synthetic anti-ferromagnet (SAF) layer by a suitable spacer layer to minimize dipole coupling between the layers, and wherein a read operation of the nanomagnet is facilitated using magnetic tunneling junction (MTJ) technology.

5. The magnetostrictive-piezoelectric multiferroic nanomagnet for implementing low energy two state Boolean logic and information processing or multistate Boolean and non-Boolean logic and information processing as recited in claim 3, wherein the magnetostrictive layer has a nominal diameter between 10 and 1000 nm and thickness between 2 and 100 nm, and the piezoelectric layer has a thickness between 10 and 500 nm.

* * * * *